(12) United States Patent
Dosho et al.

(10) Patent No.: US 8,976,054 B2
(45) Date of Patent: Mar. 10, 2015

(54) TIME-TO-DIGITAL CONVERSION CIRCUIT AND TIME-TO-DIGITAL CONVERTER INCLUDING THE SAME

(71) Applicant: Panasonic Corporation, Osaka (JP)

(72) Inventors: Shiro Dosho, Osaka (JP); Masao Takayama, Osaka (JP); Takuji Miki, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 17 days.

(21) Appl. No.: 13/942,478

(22) Filed: Jul. 15, 2013

(65) Prior Publication Data

US 2013/0335251 A1   Dec. 19, 2013

Related U.S. Application Data

(63) Continuation of application No. PCT/JP2011/004285, filed on Jul. 28, 2011.

(30) Foreign Application Priority Data

Mar. 7, 2011   (JP) .................... 2011-049200

(51) Int. Cl.
*H03M 1/50* (2006.01)
*G04F 10/00* (2006.01)

(52) U.S. Cl.
CPC ............... *H03M 1/50* (2013.01); *G04F 10/005* (2013.01)
USPC ........... 341/166; 327/146; 327/144; 327/152; 327/153; 370/517; 375/371; 375/373; 375/376

(58) Field of Classification Search
CPC ........ H03M 1/50; G04F 10/005; H03L 7/095; H03L 7/0008; H03L 7/089; H03L 7/0814; H03L 7/07; H03L 7/091; H03L 7/087; H03L 7/0095; H03L 7/0337; H04L 7/00; H04L 7/08; H04L 1/22
USPC .................. 341/155–170; 375/371, 373, 376; 370/517; 327/144, 152, 153
See application file for complete search history.

(56) References Cited

U.S. PATENT DOCUMENTS 6,379,304 B1 * 4/2002 Gilbert et al. ................. 600/447
7,010,074 B2 * 3/2006 Nakamura .................... 375/371

(Continued)

FOREIGN PATENT DOCUMENTS

JP      3953009 B2      5/2007
JP      2007-150865     6/2007

OTHER PUBLICATIONS

Notice of Allowance U.S. Appl. No. 13/589,550 dated Jul. 18, 2014.

(Continued)

*Primary Examiner* — Lam T Mai
(74) *Attorney, Agent, or Firm* — McDermott Will & Emery LLP (57) ABSTRACT

A time-to-digital conversion circuit for converting a time difference between two input signals to a 1-bit digital value, and adjusting the time difference between the two input signals to generate two output signals includes: a phase comparator configured to compare phases of the two input signals with each other to generate the digital value; a phase selector configured to output one of the two input signals which has a leading phase as a first signal, and the other of the two input signals which has a lagging phase as a second signal; and a delay unit configured to output the first signal with a delay, wherein the time-to-digital conversion circuit outputs the signal output from the delay unit and the second signal as the two output signals.

8 Claims, 7 Drawing Sheets

(56) References Cited

U.S. PATENT DOCUMENTS

| | | |
|---|---|---|
| 7,075,285 B2 * | 7/2006 | Chin ................. 324/76.54 |
| 7,098,714 B2 | 8/2006 | Lin |
| 7,417,478 B2 | 8/2008 | Kim et al. |
| 7,492,847 B2 | 2/2009 | Chou |
| 7,629,819 B2 | 12/2009 | Kwak et al. |
| 8,164,368 B2 | 4/2012 | Blodgett et al. |
| 8,482,443 B2 | 7/2013 | Kim et al. |
| 2005/0062524 A1 | 3/2005 | Kato et al. |
| 2007/0121761 A1 | 5/2007 | Dosho et al. |
| 2008/0252790 A1 | 10/2008 | Serizawa |
| 2009/0184741 A1 | 7/2009 | Suda et al. |
| 2009/0225631 A1 | 9/2009 | Shimizu et al. |

OTHER PUBLICATIONS

International Search Report PCT/JP2010/005212 dated Oct. 12, 2010 with English translation.

Minjae Lee et al., "A 9b, 1.25ps Resolution Coarse-Fine Time-to-Digital Converter in 90nm CMOS that Amplifies a Time Residue", 2007 Symposium on VLSI Circuits Digest of Technical Papers, pp. 168-169.

Toru Nakura et al., "Time Difference Amplifier using Closed-Loop Gain Control", 2009 Symposium on VLSI Circuits Digest of Technical Papers, pp. 208-209.

Minjae Lee et al., "A 9b, 1.25 ps Resolution Coarse-Fine Time-to-Digital Converter in 90 nm CMOS that Amplifies a Time Residue", IEEE Journal of Solid-State Circuits, vol. 43, No. 4, Apr. 2008, pp. 769-777.

International Search Report issued in PCT/JP2011/004285 with Date of Mailing Aug. 23, 2011.

M.A. Abas, et al., Built-in time measurement circuits—a competitive design study, IET Comput. Digit. Tech., 2007, I, (2), pp. 87-97.

D.J. Kinniment, et al., On-Chip Structures for Timing Measurement and Test, Proceedings of the Eighth International Symposium on Asynchronous Circuits and Systems (ASYNC'02), 1522-8681/02 2002 IEEE.

Jinn-Shyan Wang, An Ultra-Low-Power Fast-Lock-in Small-jitter All Digital DLL, 2005 IEEE International Solid-State Circuits Conference, 0-7803-8904-2, p. 422-423 and 607.

Notice of Allowance issued in U.S. Appl. No. 14/109,644 dated Dec. 17, 2014.

* cited by examiner

TIME-TO-DIGITAL CONVERSION CIRCUIT AND TIME-TO-DIGITAL CONVERTER INCLUDING THE SAME

CROSS-REFERENCE TO RELATED APPLICATIONS

This is a continuation of International Application No. PCT/JP2011/004285 filed on Jul. 8, 2011, which claims priority to Japanese Patent Application No. 2011-049200 filed on Mar. 7, 2011. The entire disclosures of these applications are incorporated by reference herein.

BACKGROUND

The present invention relates to a time-to-digital converters for converting signal phase differences to digital values.

In recent years, as digital phase locked loop circuits develop, time-to-digital converters, which digitize analog temporal information, have been actively developed. A typical time-to-digital converter receives a first signal into an inverter chain having a plurality of inverter circuits coupled in series, latches the output of each inverter circuit in synchronism with a second signal, and detects the point at which the status of the inverter chain changes, thereby digitizing the phase difference or time difference between the first and the second signals.

However, the numbers of latch circuits and comparators which the time-to-digital converter has to have in order to generate an n-bit digital code are each nth power of 2, which is disadvantageous in terms of circuit scale and power consumption. Thus, successive approximation time-to-digital converters for performing time-to-digital conversion by a binary search have been proposed.

In general, a successive approximation time-to-digital converter includes a plurality of time-to-digital conversion circuits coupled in cascade. In each time-to-digital conversion circuit, a phase comparator compares phases of two input signals with each other to generate a 1-bit digital value, and based on a result of the comparison of the phases, a route switch switches between routes of the two input signals such that one of the input signals which has a leading phase is input via a delay unit to a time-to-digital conversion circuit in a subsequent stage, and the other of the input signals which has a lagging phase is input directly to the time-to-digital conversion circuit in the subsequent stage. The delay units in the time-to-digital conversion circuits in the stages are set such that the delay time in each stage is reduced to a half of the delay time in a directly preceding one of the stages sequentially from the first stage, so that a time difference between the two signals input to the time-to-digital conversion circuit in the first stage is sequentially converted to a digital value by a binary search (see, e.g., Jinn-Shyan Wang, et. al, "An Ultra-Low-Power Fast-Lock-in Small-Jitter All-Digital DLL," ISSCC 2005/SESSION 22/PLL, DLL, AND VCOs/22.7, Feb. 9, 2005, pp. 422-423,607).

In such a conventional time-to-digital conversion circuit, in order to prevent the two input signals from passing through the time-to-digital conversion circuit before determination of the result of the comparison of the phases, a delay unit has to be inserted in each of two input signal paths so as to delay input of the signals to the route switch. This increases not only latency, but also the circuit scale as well as power consumption of the time-to-digital conversion circuits and the time-to-digital converter including the time-to-digital conversion circuits coupled in cascade.

Thus, there are demands for a time-to-digital conversion circuit in which the latency, the circuit scale, and the power consumption are reduced.

SUMMARY

A time-to-digital conversion circuit according to an example of the present invention is a time-to-digital conversion circuit for converting a time difference between two input signals to a 1-bit digital value, and adjusting the time difference between the two input signals to generate two output signals, and includes: a phase comparator configured to compare phases of the two input signals with each other to generate the digital value; a phase selector configured to output one of the two input signals which has a leading phase as a first signal, and the other of the two input signals which has a lagging phase as a second signal; and a delay unit configured to output the first signal with a delay, wherein the time-to-digital conversion circuit outputs the signal output from the delay unit and the second signal as the two output signals.

With this configuration, the phase selector distinguishes between one of the two input signals which has a leading phase and the other of the two input signals which has a lagging phase without waiting for a result of the comparison of the phases by the phase comparator, and the delay unit outputs the signal having the leading phase with a delay. Thus, it is not necessary to insert a delay unit for preventing the two input signals from passing through the circuit before determination of the result of the comparison of the phases.

The phase selector may include a first logic circuit configured to perform a logical AND operation of the two input signals, and a second logic circuit configured to perform a logical OR operation of the two input signals, and may output any one of output signals from the first and second logic circuits as the first signal and the other of the output signals from the first and second logic circuits as the second signal.

Moreover, the first logic circuit may include a NAND circuit, the second logic circuit may include a NOR circuit, and the NAND circuit and the NOR circuit may form a symmetric circuit configuration.

With this configuration, it is possible to eliminate or reduce an offset delay caused in an output of the phase selector due to a difference of gate configurations between the NOR circuit and the NAND circuit, which can improve the input/output characteristics of the phase selector.

Moreover, the phase selector may include a time difference amplifier configured to amplify a time difference between the output signals of the first and second logic circuits to output two signals, and may output the two signals output from the time difference amplifier as the first and second signals. Alternatively, the phase selector may include a time difference amplifier configured to amplify the time difference between the two input signals to output two signals, and the first and second logic circuits may perform a logical operation of the two signals output from the time difference amplifier.

With this configuration, when the time difference between the two input signals is significantly small, the input/output characteristics of the phase selector can be improved and approximated to the ideal characteristics.

Moreover, a time-to-digital converter according to an example of the present invention is configured to convert a time difference between two input signals to a digital code, and includes the above-described time-to-digital conversion circuit including a plurality of time-to-digital conversion circuits coupled in cascade, wherein delay times of the delay units in the time-to-digital conversion circuits are set such that the delay time of each delay unit is reduced to a half of the delay time of a directly preceding one of the delay units sequentially from the time-to-digital conversion circuit in a first stage.

With this configuration, it is possible to obtain a time-to-digital converter having a high speed, a small circuit area, and low power consumption.

DETAILED DESCRIPTION (First Embodiment)

Figure 1:
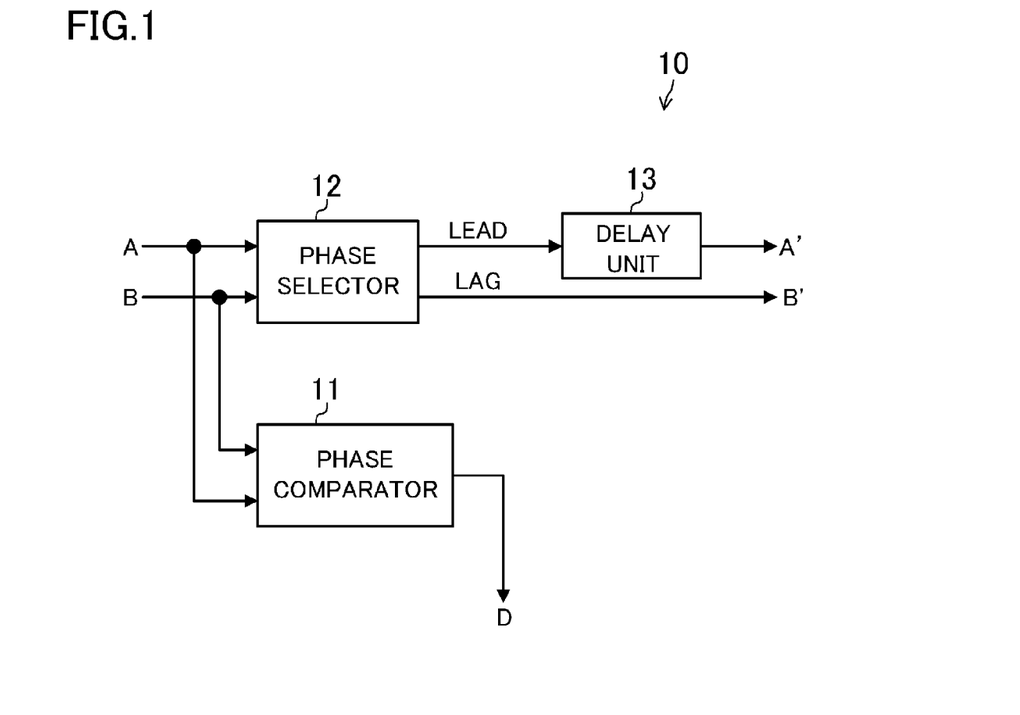
FIG. 1 is a view illustrating a configuration of a time-to-digital conversion circuit according to a first embodiment.

FIG. 1 illustrates a configuration of a time-to-digital conversion circuit according to a first embodiment. A time-to-digital conversion circuit 10 according to the present embodiment converts a time difference between signals A and B to a 1-bit digital value D, and adjusts the time difference between the signals A and B to output signals A' and B'.

Specifically, the time-to-digital conversion circuit 10 includes a phase comparator 11 configured to compare phases of the signals A and B with each other to generate the digital value D, a phase selector 12 configured to output one of the signals A or B which has a leading phase as a signal LEAD and the other of the signals A or B which has a lagging phase as a signal LAG, and a delay unit 13 configured to output the signal LEAD with a delay. The signal output from the delay unit 13 corresponds to the signal A', and the signal LAG corresponds to the signal B'.

The delay unit 13 can be a buffer circuit including a plurality of inverter circuits coupled in cascade. The delay amount can be adjusted by varying the number of inverter circuits coupled in cascade.

The phase comparator 11 performs comparison of timing of a rising edge or a falling edge between the signals A and B, thereby performing phase comparison between the signals A and B. The phase comparator 11 can be a RS flip-flop. For example, in performing comparison of timing of the rising edge, when the signal B transitions from a L level to a H level after the signal A has transitioned from the L level to the H level, the phase comparator 11 detects that the phase of the signal A leads the phase of the signal B, and outputs "1" as the digital value D. On the other hand, when the signal A transitions from the L level to the H level after the signal B has transitioned from the L level to the H level, the phase comparator 11 detects that the phase of the signal A lags the phase of the signal B, and outputs "0" as the digital value D.

Figure 2:
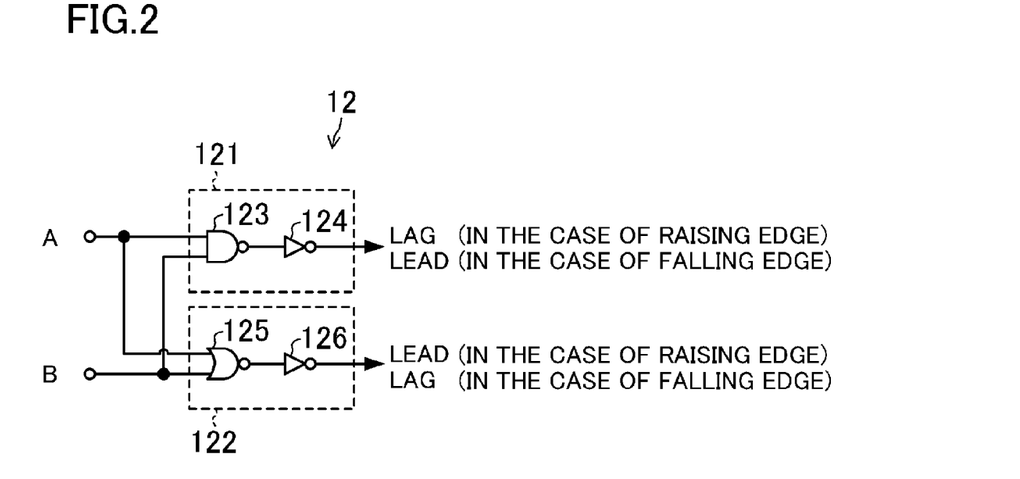
FIG. 2 is an example schematic diagram illustrating a phase selector.
Figure 3A:
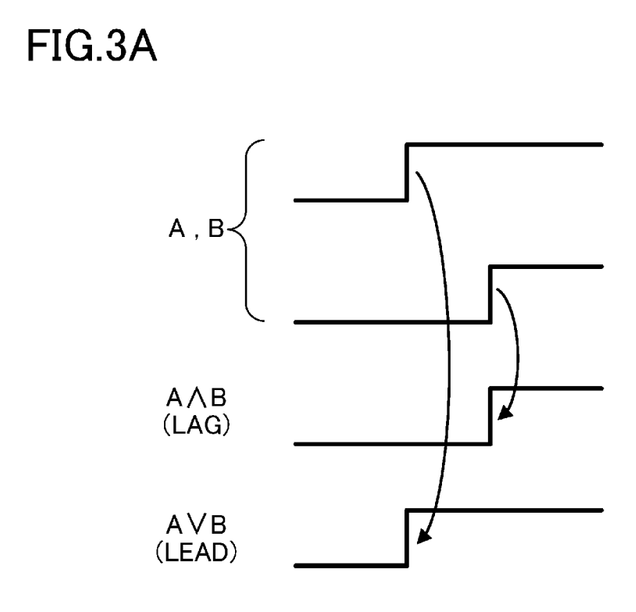
FIGS. 3a AND 3b are timing diagrams of input/output signals of the phase selector.
Figure 3B:
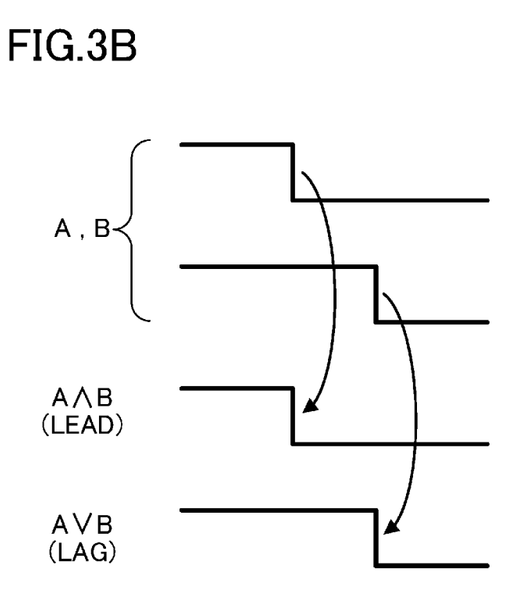

The phase selector 12 performs a logical operation of the signals A and B to distinguish between one of the signals A or B which has a leading phase and the other of the signals A or B which has a lagging phase. FIG. 2 illustrates an example circuit configuration of the phase selector 12. The phase selector 12 can include an AND circuit 121 configured to perform a logical AND operation of the signals A and B, and an OR circuit 122 configured to perform a logical OR operation of the signals A and B. When rising edges are input as the signals A and B, as illustrated in FIG. 3A, an output signal of the AND circuit 121 corresponds to the signal LAG, and an output signal of the OR circuit 122 corresponds to the signal LEAD. In contrast, when falling edges are input as the signals A and B, as illustrated in FIG. 3B, an output signal of the AND circuit 121 corresponds to the signal LEAD, and an output signal of the OR circuit 122 corresponds to the signal LAG.

More specifically, the AND circuit 121 can include a NAND circuit 123 and an inverter circuit 124 configured to invert an output of the NAND circuit 123. The OR circuit 122 can include a NOR circuit 125, and an inverter circuit 126 configured to invert an output of the NOR circuit 125.

Figure 4:
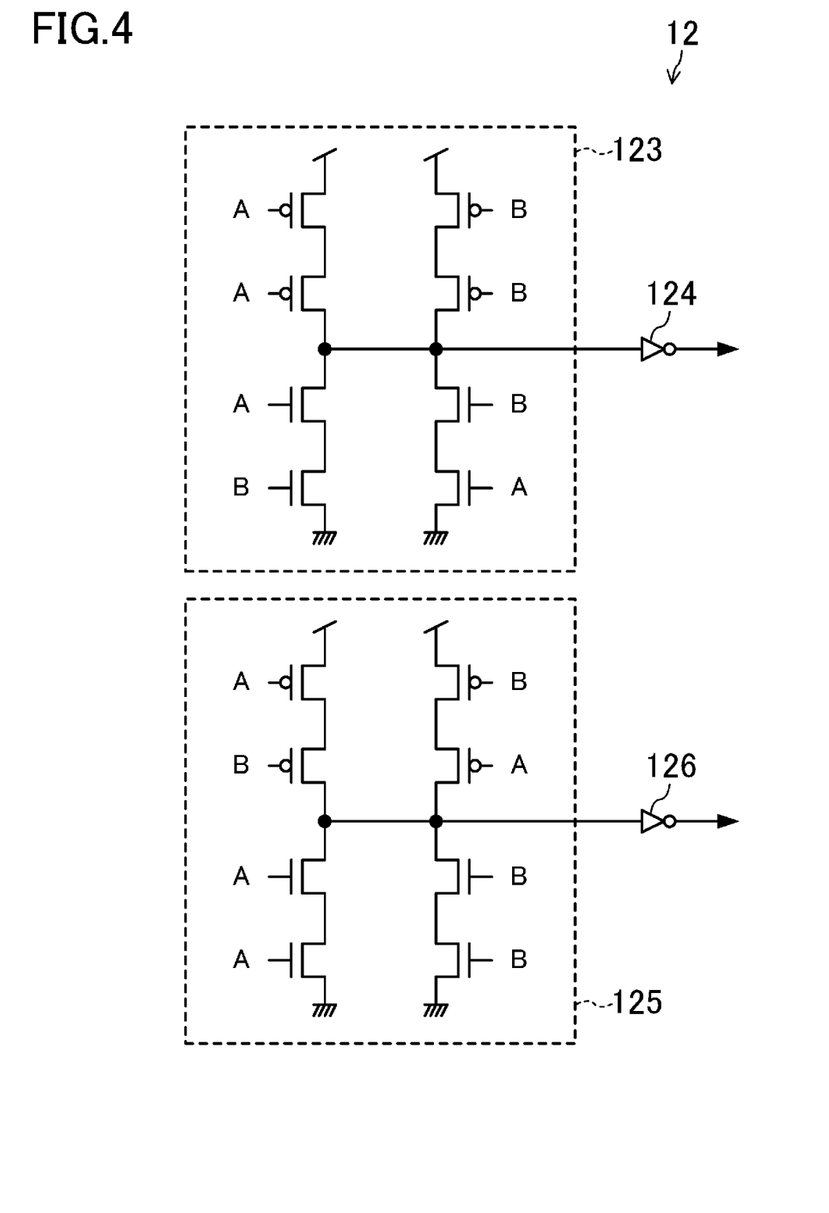
FIG. 4 is a schematic diagram illustrating a phase selector in which a NAND circuit and a NOR circuit are symmetrical.
Figure 7:
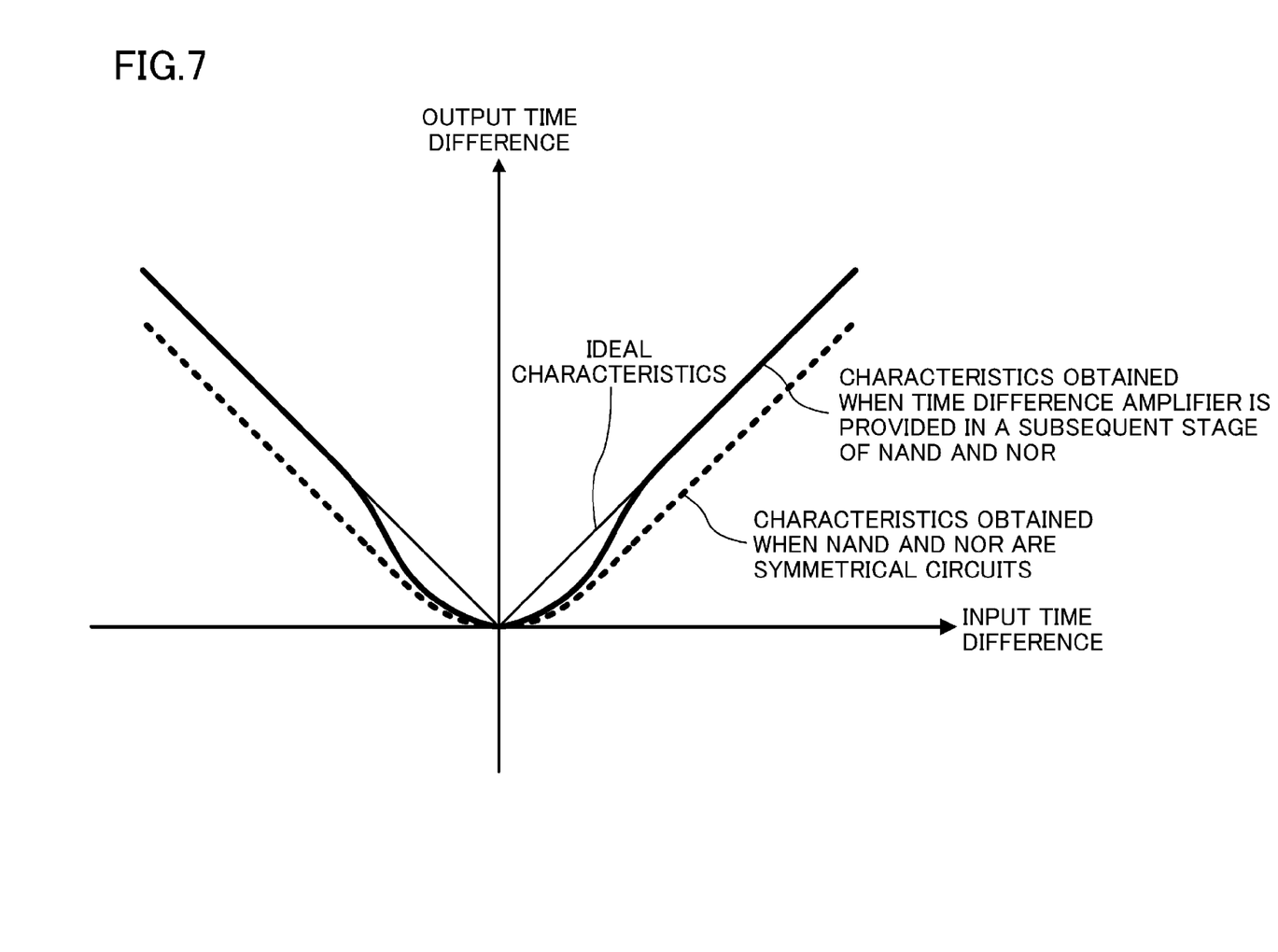
FIG. 7 is a graph illustrating the input/output characteristics of the phase selector.

In general, a configuration of the gate is different between a NAND circuit and a NOR circuit, and thus gate delays are different. Thus, when the NAND circuit 123 and the NOR circuit 125 have general circuit configurations, an offset delay is added to an output of the phase selector 12 due to the difference between the gate delays. As described later, when multiple ones of the time-to-digital conversion circuit 10 are coupled in cascade to form a time-to-digital converter, an offset delay included in an output of at least one of the phase selectors 12 may reduce conversion accuracy. Thus, as illustrated in, for example, FIG. 4, the NAND circuit 123 and the NOR circuit 125 may be configured as symmetric circuits whose input load capacitances are equal to each other. With this configuration, input/output characteristics of the phase selector 12 can be characteristics without an offset delay as indicated by the broken line in FIG. 7.

Figure 5A:
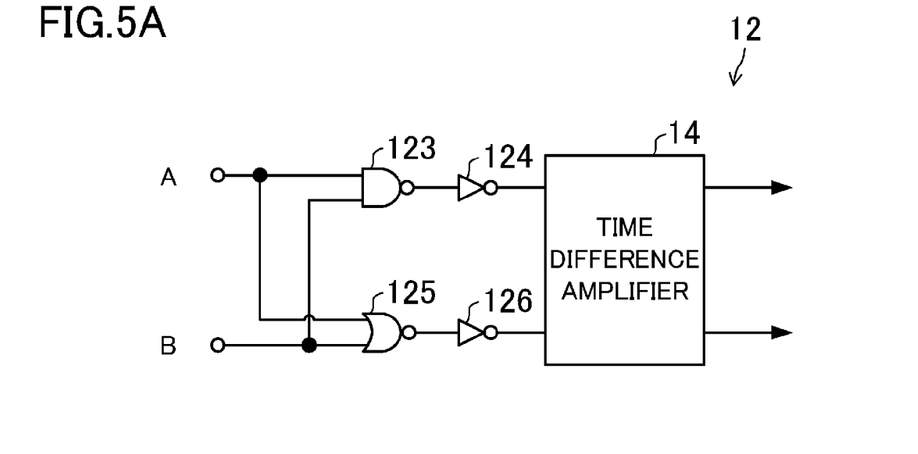
FIGS. 5A-5C are schematic diagrams in which the phase selector further includes a time difference amplifier.
Figure 5B:
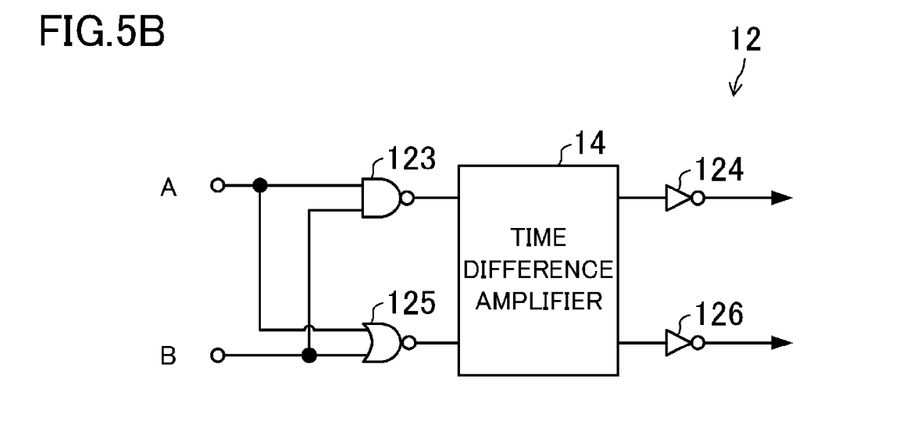
Figure 5C:
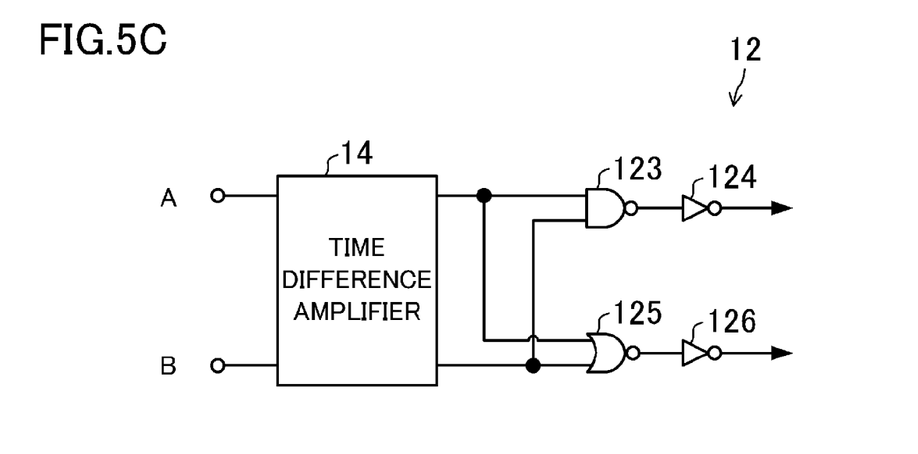

Moreover, when the time difference between the signals A and B is significantly small, the NAND circuit 123 and the NOR circuit 125 behave in a manner comparable to the case where identical signals are input as the signals A and B, and operate as inverter circuits having substantially doubled drivability. Thus, as indicated by the broken line in FIG. 7, a gain of an output time difference with respect to an input time difference may be reduced to 1 or less near a point at which the input time difference is zero. Thus, as illustrated in FIG. 5, a time difference amplifier 14 configured to amplify the time difference between the two input signals may be provided in a subsequent stage or a preceding stage of the NAND circuit 123 and the NOR circuit 125. FIG. 5A illustrates an example in which the time difference amplifier 14 is provided directly downstream of the inverter circuit 124 and the inverter circuit 126. FIG. 5B illustrates an example in which the time difference amplifier 14 is provided directly downstream of the NAND circuit 123 and the NOR circuit 125. FIG. 5C illustrates an example in which the time difference amplifier 14 is provided directly upstream of the NAND circuit 123 and the NOR circuit 125. As described above, the time difference amplifier 14 is provided to amplify the output time difference or the input time difference which is substantially zero, so that, as indicated by the bold solid line in FIG. 7, the input/output characteristics of the phase selector 12 can be improved and approximated to the ideal characteristics.

Figure 6:
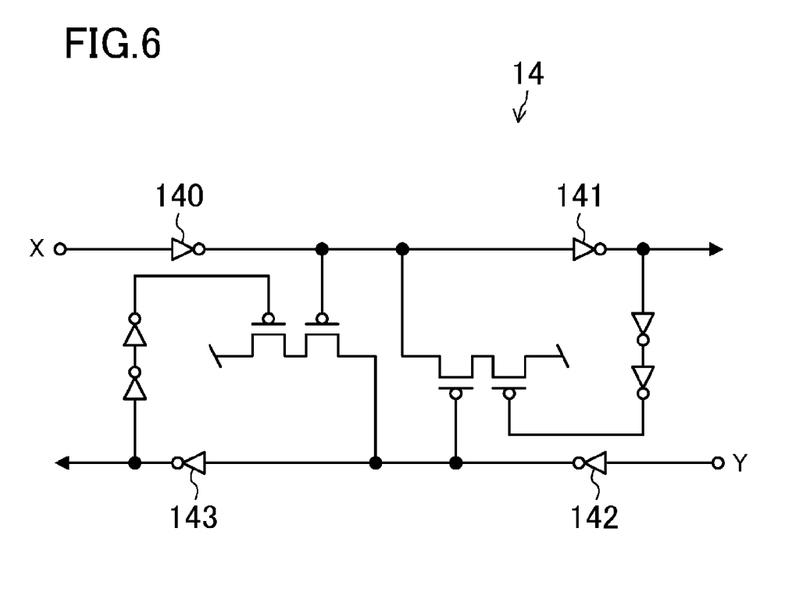
FIG. 6 is an example schematic diagram illustrating the time difference amplifier.

FIG. 6 illustrates an example circuit configuration of the time difference amplifier 14. A signal X input to the time difference amplifier 14 passes through a signal path including two inverter circuits 140 and 141, and then is output. A signal Y input to the time difference amplifier 14 passes through a signal path including two inverter circuits 142 and 143, and then is output. These signal paths are connected to each other so that one of the signal paths through which a rising edge passed first delays transition of the logic level in the other of the signal paths. Note that the circuit configuration of the time difference amplifier 14 is not limited to this embodiment, but various other configurations are possible.

As descried above, according to the present embodiment, the time difference between the two input signals can be adjusted without waiting for the result of the comparison of the phases, and the adjusted time difference can be output. Thus, it is no longer necessary to insert a delay unit in the two input signal paths to wait for the result of the comparison of the phases, so that the latency of the time-to-digital conversion circuit can be reduced, and the circuit scale and the power consumption can also be reduced.

(Second Embodiment)

Figure 8:
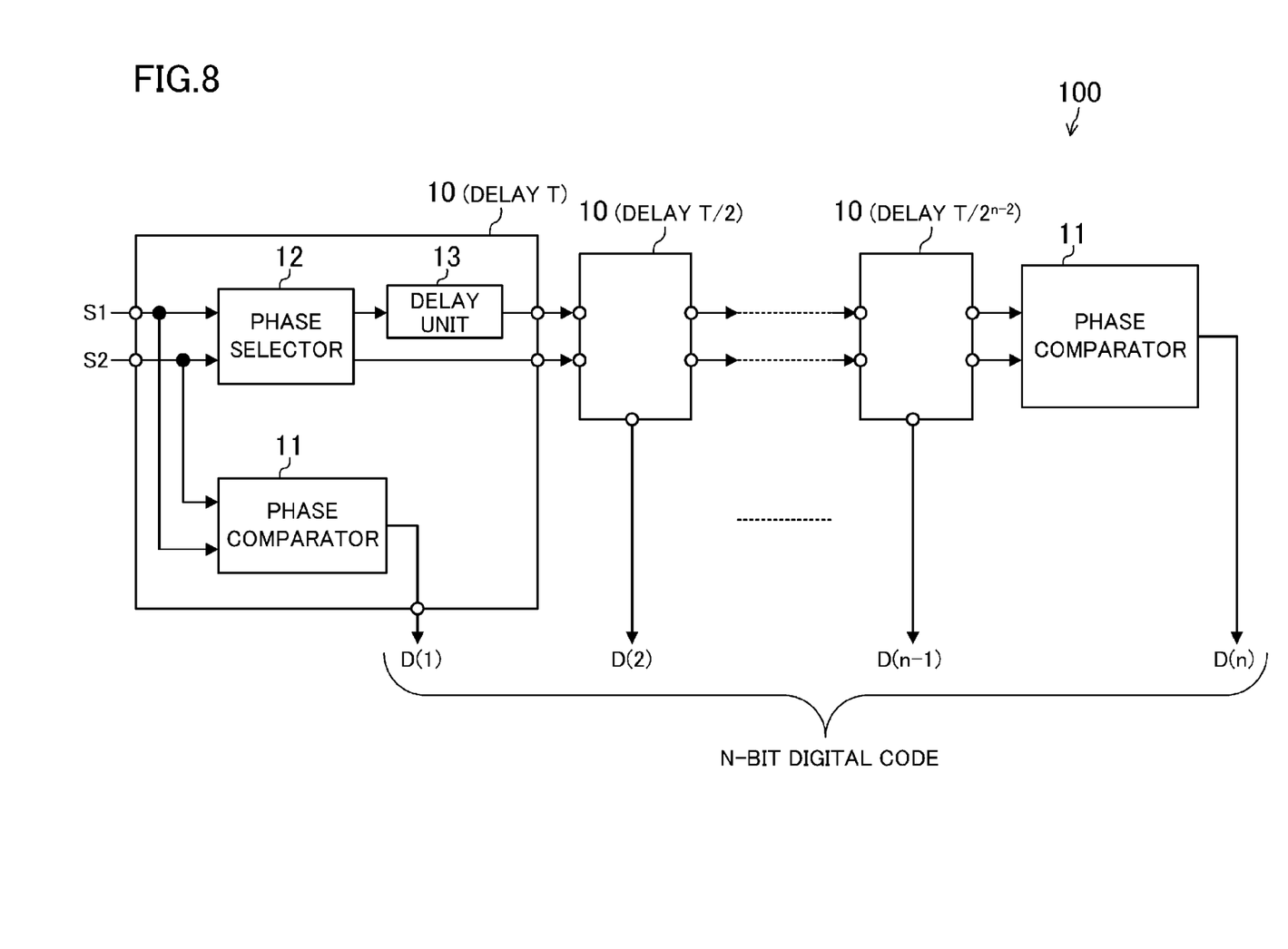
FIG. 8 is a view illustrating a configuration of a time-to-digital converter according to a second embodiment.

FIG. 8 illustrates a configuration of a time-to-digital converter according to a second embodiment. A time-to-digital converter 100 according to the present embodiment is configured to convert a time difference between input signals S1 and S2 to an n-bit digital code, and includes the time-to-digital conversion circuit 10 of the first embodiment including n−1 time-to-digital conversion circuits coupled in cascade, and a phase comparator 11 in the last stage.

When the conversion input range of the time-to-digital converter 100 is ±T, the delay times of the delay units 13 of the time-to-digital conversion circuits 10 are set, for example, such that the delay time in the first stage is T, the delay time in the second stage is T/2, and the delay time in the last stage ((n−1)th stage) is $T/2^{n-2}$, that is, the delay time of each delay unit is reduced to a half of the delay time of a directly preceding one of the delay units sequentially from the time-to-digital conversion circuit 10 in the first stage. The digital output D(1) of the time-to-digital conversion circuit 10 in the first stage corresponds to the MSB of the digital code, and the digital output D(n) of the phase comparator 11 corresponds to the LSB.

As described above, according to the present embodiment, time-to-digital conversion circuits 10 having low latency, a small circuit area, and low power consumption are used, so that it is possible to obtain a time-to-digital converter with a high speed, a small circuit area, and low power consumption.

A gray-coded n-bit digital code is output from the time-to-digital converter 100, but the gray code is easily converted to a normal binary code.

Moreover, in the last stage, the phase comparator 11 is provided, because signals do not have to be transmitted from the last stage to a subsequent stage, and thus the phase selector 12 and the delay unit 13 are omitted from the time-to-digital conversion circuit 10. However, the time-to-digital conversion circuit 10 may also be provided in the last stage.

What is claimed is:

1. A time-to-digital conversion circuit for converting a time difference between two input signals to a 1-bit digital value, and adjusting the time difference between the two input signals to generate two output signals, the time-to-digital conversion circuit comprising:
a phase comparator configured to compare phases of the two input signals with each other to generate the digital value;
a phase selector configured to output one of the two input signals which has a leading phase as a first signal, and the other of the two input signals which has a lagging phase as a second signal; and
a delay unit configured to output the first signal with a delay, wherein
the time-to-digital conversion circuit outputs the signal output from the delay unit and the second signal as the two output signals.

2. The time-to-digital conversion circuit of claim 1, wherein
the phase selector includes a first logic circuit configured to perform a logical AND operation of the two input signals, and a second logic circuit configured to perform a logical OR operation of the two input signals, and outputs any one of output signals from the first and second logic circuits as the first signal and the other of the output signals from the first and second logic circuits as the second signal.

3. The time-to-digital conversion circuit of claim 2, wherein
the first logic circuit includes a NAND circuit,
the second logic circuit includes a NOR circuit, and
the NAND circuit and the NOR circuit form a symmetric circuit configuration.

4. The time-to-digital conversion circuit of claim 2, wherein
the phase selector includes a time difference amplifier configured to amplify a time difference between the output signals of the first and second logic circuits to output two signals, and outputs the two signals output from the time difference amplifier as the first and second signals.

5. The time-to-digital conversion circuit of claim 3, wherein
the phase selector includes a time difference amplifier configured to amplify a time difference between the output signals of the first and second logic circuits to output two signals, and outputs the two signals output from the time difference amplifier as the first and second signals.

6. The time-to-digital conversion circuit of claim 2, wherein
the phase selector includes a time difference amplifier configured to amplify the time difference between the two input signals to output two signals, and
the first and second logic circuits perform logical operations of the two signals output from the time difference amplifier.

7. The time-to-digital conversion circuit of claim 3, wherein
the phase selector includes a time difference amplifier configured to amplify the time difference between the two input signals to output two signals, and
the first and second logic circuits perform logical operations of the two signals output from the time difference amplifier.

8. A time-to-digital converter for converting a time difference between two input signals to a digital code, the time-to-digital converter comprising:
the time-to-digital conversion circuit of claim 1 including a plurality of time-to-digital conversion circuits coupled in cascade, wherein
delay times of the delay units in the time-to-digital conversion circuits are set such that the delay time of each delay unit is reduced to a half of the delay time of a directly preceding one of the delay units sequentially from the time-to-digital conversion circuit in a first stage.

* * * * *